(12) United States Patent
Page

(10) Patent No.: US 10,920,946 B2
(45) Date of Patent: Feb. 16, 2021

(54) IN-MOLD ELECTRONICS PACKAGE

(71) Applicant: Dura Operating, LLC, Auburn Hills, MI (US)

(72) Inventor: Indraneel Page, Farmington Hills, MI (US)

(*) Notice: Subject to any disclaimer, the term of this patent is extended or adjusted under 35 U.S.C. 154(b) by 7 days.

(21) Appl. No.: 16/426,839

(22) Filed: May 30, 2019

(65) Prior Publication Data

US 2020/0378574 A1 Dec. 3, 2020

(51) Int. Cl.
| | |
|---|---|
| *G02B 6/08* | (2006.01) |
| *G02F 1/13357* | (2006.01) |
| *G06F 1/16* | (2006.01) |
| *H01R 13/717* | (2006.01) |
| *H01H 13/83* | (2006.01) |
| *F21V 8/00* | (2006.01) |
| *F21S 41/141* | (2018.01) |
| *G06F 3/044* | (2006.01) |
| *H01L 33/48* | (2010.01) |
| *H01L 33/58* | (2010.01) |
| *H01L 33/52* | (2010.01) |

(52) U.S. Cl.
CPC ............ *F21S 41/141* (2018.01); *G06F 3/044* (2013.01); *H01L 33/483* (2013.01); *H01L 33/52* (2013.01); *H01L 33/58* (2013.01)

(58) Field of Classification Search
CPC .... G02B 6/008; G02B 6/0011; G02B 6/0021; G02F 1/13357; G06F 1/16; H01R 13/717; H01H 13/83; F21V 8/00

USPC ............. 361/760, 679.32, 679.43, 732, 737; 439/58, 159, 352, 946; 362/23.03, 97.1, 362/611

See application file for complete search history.

(56) References Cited

U.S. PATENT DOCUMENTS

| | | | | |
|---|---|---|---|---|
| 5,504,648 | A * | 4/1996 | Honda ................. | G06F 1/1616 361/679.43 |
| 5,544,007 | A * | 8/1996 | Inoue ................... | G06F 1/1656 361/679.32 |
| 9,869,810 | B2 | 1/2018 | Keranen et al. | |
| 2010/0165237 | A1* | 7/2010 | Jung .................... | G02B 6/0073 349/58 |
| 2010/0271806 | A1* | 10/2010 | Bae ....................... | G02B 6/008 362/97.1 |
| 2013/0100637 | A1* | 4/2013 | Wang .................... | H01H 13/83 362/23.03 |
| 2015/0092445 | A1* | 4/2015 | Kunimochi .......... | G02B 6/0021 362/611 |

FOREIGN PATENT DOCUMENTS

WO 2017178703 A1 10/2017

\* cited by examiner

*Primary Examiner* — Xiaoliang Chen
(74) *Attorney, Agent, or Firm* — Vivacqua Crane

(57) ABSTRACT

An in-mold electronics package includes a printed circuit board (PCB) having a first side and a second side, the PCB defining an opening, a light emitting diode (LED) disposed on the second side adjacent the opening, a light guide disposed on the second side of the PCB and partially disposed within the opening, a film disposed on the first side of the PCB, and a cover disposed over the film, the cover connected to the light guide, and wherein the cover and the light guide cooperate to form at least one sealed perimeter wall of the in-mold electronics package.

19 Claims, 4 Drawing Sheets

IN-MOLD ELECTRONICS PACKAGE

FIELD

The present disclosure relates generally to in-mold electronics packages, and more particularly to in-mold electronics packages for use in motor vehicle trim parts.

BACKGROUND

The statements in this section merely provide background information related to the present disclosure and may or may not constitute prior art.

Electronics packages with backlit visual elements used in motor vehicle trim parts may be manufactured via several processes. Most commonly, a plastic part of a polymeric material resin is molded with some portion of the plastic being clear or translucent, with electronics components including one or more light sources attached mechanically to the part after molding, so that light is visible through the clear or translucent portion, resulting in a backlighting effect.

More recently, methods have been developed of embedding the electronics in a molded plastic part. One such method is to encapsulate light sources and associated electronics components (collectively "electronics package") in a clear resin via low-pressure molding and then to injection-mold plastic over or around the electronics package. These in-mold electronics packages are thereby embedded in the plastic, with some portion of the plastic being clear or translucent so that light from the encapsulated package is visible through the clear or translucent plastic, resulting in a backlighting effect.

Another such method is to mount the electronics package onto a polymer film, form the film into a desired shape, and then insert the formed film into an injection mold having substantially the same shape. A following step injection-molds plastic onto the film such that the electronics package is embedded between the film on which it is mounted and the plastic that has been molded onto it, with portions of the film and/or plastic being clear or translucent such that light from the light sources is visible from the part exterior, resulting in a backlighting effect.

However, where electronics packages are used in-mold, as described above, the heat and pressure associated with the injection molding may cause damage to the components of the electronics package. Thus, while current electronics packages achieve their intended purpose, there is a need for a new and improved electronics packages that may be used in-mold without suffering damage during the injection molding process.

SUMMARY

According to several aspects of the present disclosure, an in-mold electronics package is provided. The in-mold electronics package includes a printed circuit board (PCB) having a first side and a second side, the PCB defining an opening, a light emitting diode (LED) disposed on the second side adjacent the opening, a light guide disposed on the second side of the PCB and partially disposed within the opening, a film disposed on the first side of the PCB, and a cover disposed over the film, the cover connected to the light guide, and wherein the cover and the light guide cooperate to form at least one sealed perimeter wall of the in-mold electronics package.

In one aspect, the light guide and the cover encapsulate the PCB and the film.

In another aspect, the film is adhered to the cover by an adhesive layer.

In another aspect, the film is adhered to the PCB by an adhesive layer.

In another aspect, a reflector is disposed on the light guide opposite the PCB.

In another aspect, the cover is translucent.

In another aspect, the cover is comprised of a same material as the light guide.

In another aspect, the cover is secured to the light guide at the at least one sealed perimeter wall.

In another aspect, the cover is secured to the light guide by a pin.

In another aspect, the cover is secured to the light guide by an ultrasonic weld.

In another aspect, the cover is more heat and pressure resistant than the film.

In another aspect, the light guide includes a side wall extending from a base portion, the side wall in contact with the cover to form the at least one sealed perimeter wall of the in-mold electronics package.

In another aspect, the cover includes a cover side wall extending from a plate portion, the cover side wall in contact with the light guide to form the at least one sealed perimeter wall of the in-mold electronics package.

In another aspect, the film includes translucent portions and non-translucent portions.

In another aspect, the PCB includes a touch capacitive sensor disposed adjacent the opening on the first side.

According to several other aspects of the present disclosure, an in-mold electronics package is provided. The in-mold electronics package includes a printed circuit board (PCB) having a first side and a second side, the PCB defining a opening, a light emitting diode (LED) disposed on the second side adjacent the opening, a light guide disposed on the second side of the PCB and partially disposed within the opening, a reflector disposed on a side of the light guide opposite the PCB, a film disposed on the first side of the PCB, and a cover disposed over the film, the cover connected to the light guide, and wherein the cover and the light guide cooperate to substantially encapsulate the PCB and the film.

According to several other aspects of the present disclosure, a trim part for a motor vehicle is provided. The trim part includes an electronics package including a front side and a back side, the electronics package having a printed circuit board (PCB) having a first side facing the front side of the electronics package and a second side facing the back side of the electronics package, the PCB defining a opening, a light emitting diode (LED) disposed on the second side adjacent the opening, a light guide disposed on the second side of the PCB and partially disposed within the opening, a film disposed on the first side of the PCB, and a cover disposed over the film, the cover connected to the light guide, and wherein the cover and the light guide cooperate to form at least one sealed perimeter wall of the in-mold electronics package. A substrate is injection molded onto the back side of the electronics package. A resin layer is injection molded onto the front side of the electronics package.

In one aspect, the resin layer is translucent.

In another aspect, the cover and the light guide encapsulate the PCB and the film.

In another aspect, the substrate has the properties of an injection molded material and the resin layer has the properties of an injection molded material.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
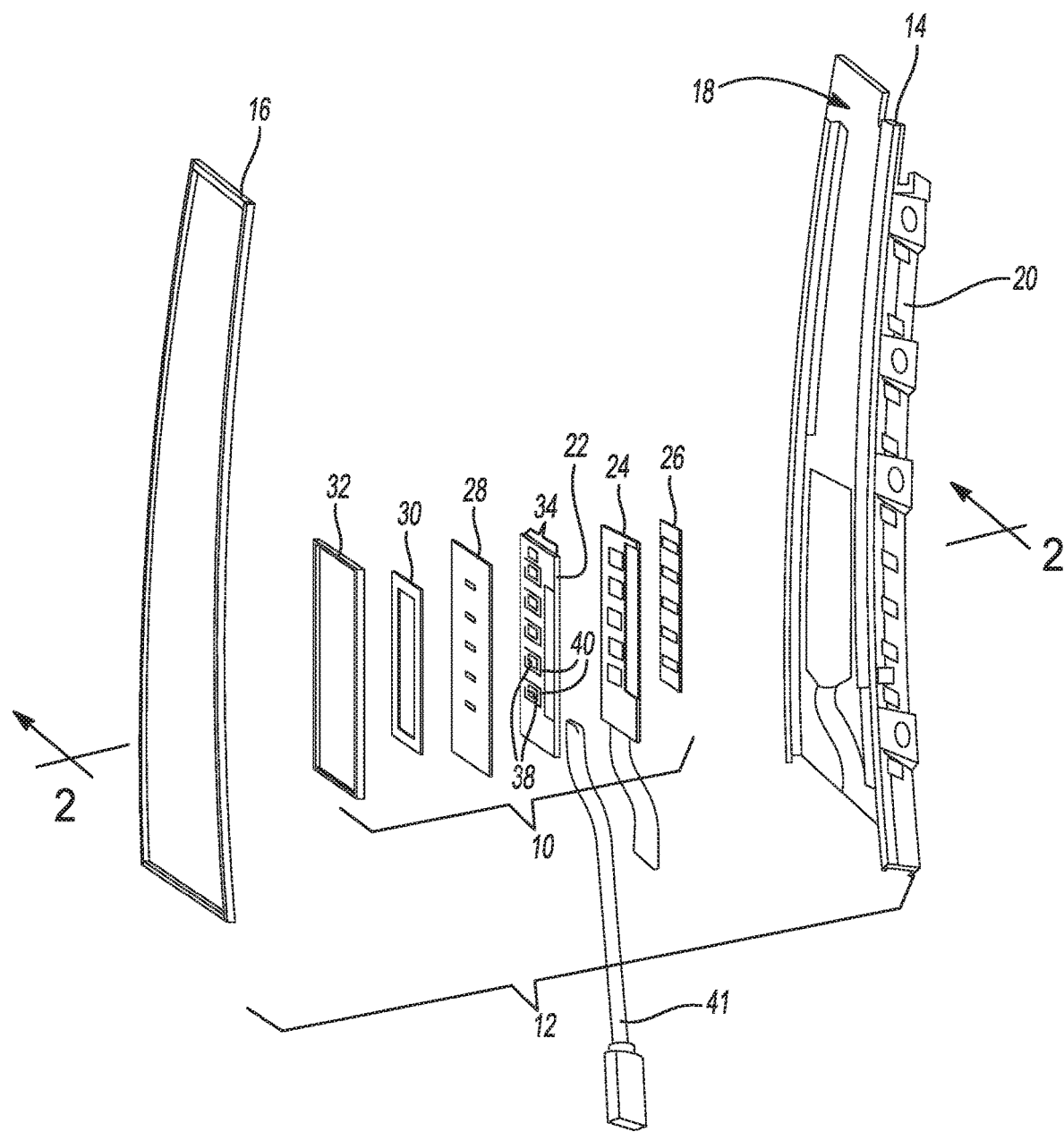
FIG. 1 is an exploded, perspective view of a trim part having an in-mold electronics package according to an exemplary embodiment.

Referring to FIG. 1, an in-mold electronics package 10 according to the principles of the present disclosure is shown with an exemplary trim part 12. In one aspect, the trim part 12 forms an exterior surface of a motor vehicle (not shown). For example, the trim part 12 may be part of an exterior pillar trim, liftgate spoiler, aero fin, windscreen header cover, liftgate center bezel. In another aspect, the trim part 12 forms an interior surface of a motor vehicle. For example, the trim part 12 may be part of an interior trim panel, such as a center stack, an instrument panel, an air condition control panel, an insert in door trim panels (e.g. control for opening regulators), etc. The trim part 12 is formed in a two shot injection molding process that encapsulates the in-mold electronics package 10. The trim part 12 generally includes a substrate 14 and a resin layer 16 that encapsulate the in-mold electronics package 10. The substrate 14 is rigid and has an exterior decorative surface 18. In one aspect, the exterior decorative surface 18 is glossy and optically continuous. The substrate 14 also includes an interior surface 20 disposed underneath the exterior decorative surface 18. The interior surface 20 includes various flanges, fasteners, and other features, used to provide structural support to the substrate 14 and to facilitate connecting the trim part 12 to a motor vehicle. The substrate 14 is preferably formed of an acrylonitrile butadiene styrene (ABS) plastic. The resin layer 16 is disposed overtop the exterior decorative surface 18. The resin layer 16 is preferably formed of a translucent or semi transparent material such as, for example, polymethylmethacrylate (PMMA), polycarbonate, Polyurea, Polyurethane, etc. Both the substrate 14 and the resin layer 16 have the properties of an injection molded material, as is known in the art.

The in-mold electronics package 10 is a human machine interface configured to provide lighting and control functions through the resin layer 16. For example, a user may enter a code or command via the in-mold electronics package 10 and generate an output. The output may be to unlock the motor vehicle, start the motor, turn on lights, etc. The in-mold electronics package 10 generally includes a printed circuit board (PCB) 22, a light guide 24, a reflector 26, a film 28, an adhesive layer 30, and a cover 32.

Figure 2:
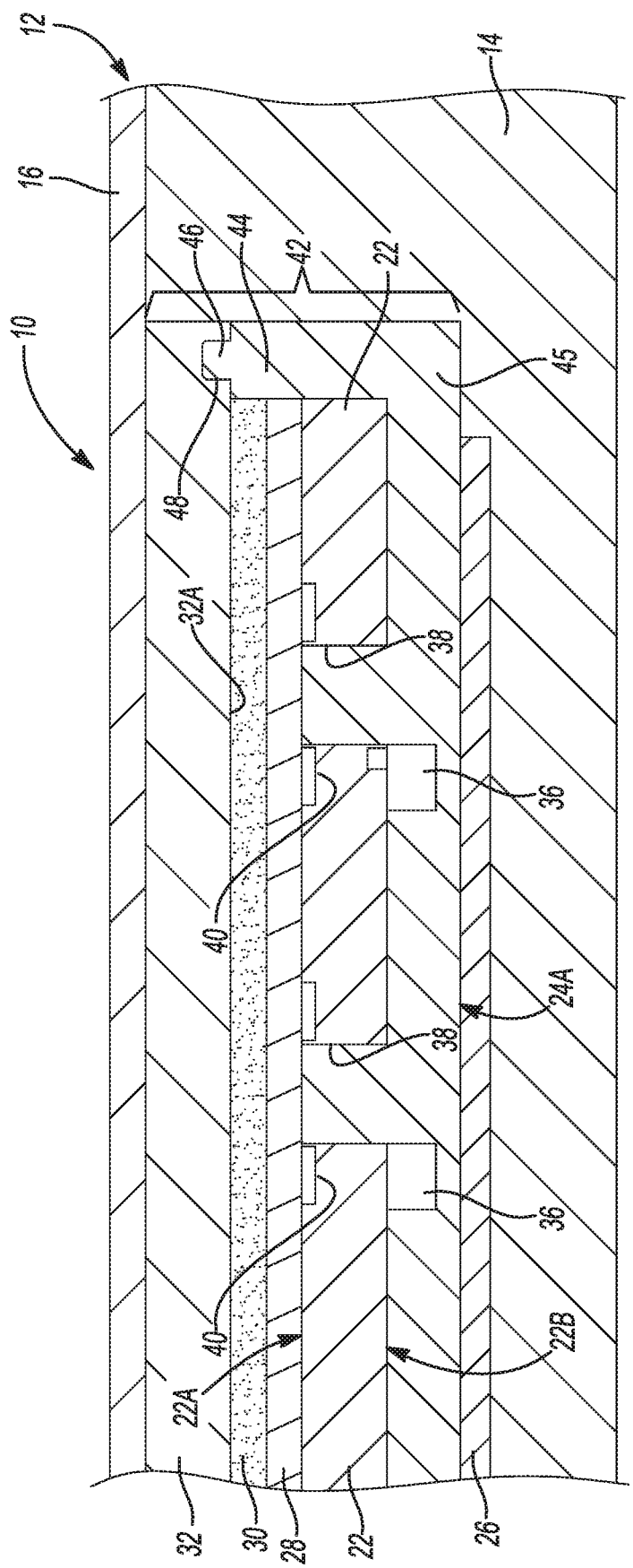
FIG. 2 is cross-section of the trim part viewed in the direction of arrows 2-2 in FIG. 1.

FIG. 2 shows a cross-section view of the in-mold electronics package 10 and the trim part 12. The PCB 22 includes electrical components 34 including, for example, a control circuit in electrical communication with a touch sensing circuit, neither of which are shown. The electrical components 34 are disposed on one of, or both, of a first side 22A of the PCB 22 and a second side 22B of the PCB 22. A number of light emitting diodes (LED's) 36 are connected via conductive traces (not shown) to the control circuit and the touch sensing circuit. The LED's 36 are disposed on the second side 22B of the PCB 22. The LED's 36 are each disposed adjacent openings 38 that extend through the PCB 22. A capacitive touch sensor 40 is disposed around each of the openings 38 on the first side 22A. The capacitive touch sensors 40 include X and Y electrodes (not shown) that complete a circuit when closed by a user's touch. The PCB 22 is connected to a pigtail integrated connector 41 (FIG. 1).

The light guide 24 is disposed on the second side 22B of the PCB 22. The light guide 24 is molded from a single injection molding shot of an optically clear polymeric material such as polymethyl methacrylate (PMMA) which is transparent or translucent to allow light passage through the light guide 24. The light guide 24 is disposed around the LED's 36 and is disposed within the openings 38 of the PCB 22. The light guide 24 partially encapsulates the PCB 22 and the film 28, as will be described in greater detail below. The reflector 26 is disposed on an inward side 24A of the light guide 24. Light emitted by the LED's 36 travels through the light guide 24 and is reflected by the reflector 26 through the openings 38.

The film 28 is disposed on the front side 22A of the PCB 22. The film 28 may include translucent, partially translucent, or opaque portions that depict numbers, images, etc. Light emitted by the LED's 36 is transmitted through the film 28 via the openings 38.

The adhesive layer 30 is disposed between the film 28 and the cover 32. In another aspect, the adhesive layer 30 is disposed between the PCB 22 and the film 28. The adhesive layer 30 may be any suitable tape or coating for use in injection molded components. The adhesive layer 30 helps secure the PCB 22 and film 28 to the cover 32. However, it should be appreciated that the adhesive layer 30 is optional and is not present in certain aspects of the present disclosure.

Figure 3:
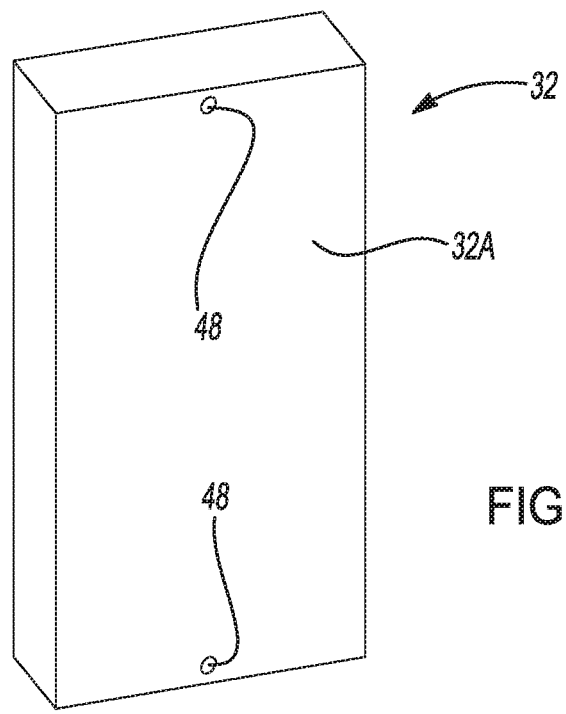
FIG. 3 is a bottom perspective view of a cover used in the in-mold electronics package.

The cover 32 is disposed over the film 28 and cooperates with the light guide 24 to at least partially encapsulate the PCB 22 and the film 28. The cover 32 is comprised of an optically clear polymeric material such as polymethyl methacrylate (PMMA) which is transparent or translucent to allow light passage through the cover 32. In one aspect, the cover 32 is comprised of the same material as the light guide 24. The cover 32 cooperates with the light guide 24 to form at least one sealed perimeter wall 42 of the in-mold electronics package 10. In a first example illustrated in FIG. 2 and FIG. 3, the cover 32 is planar and the light guide 24 includes a side wall 44 extending from a base portion 45. A pin 46 is disposed on a distal end of the side wall 44. The pin 46 is disposed within a slot 48 formed in a first side 32A of the cover 32. Thus, the side wall 44 of the light guide 24 contacts the PCB 22 and the film 28. The cover 32 may be ultrasonically welded to the light guide 24 at the side wall 44 and pin 46. The cover 32 protects the film 28 during the injection molding process as the cover 32 is more heat and pressure resistant than the film 28.

The cover 32 may be connected to the light guide 24 in various ways in addition to or alternatively with the pin 46, the slot 48 and the ultrasonic weld. For example, a ridge and groove, snap fit connection, or an adhesive, to name but a few, may be employed without departing from the scope of the present disclosure.

Figure 5:
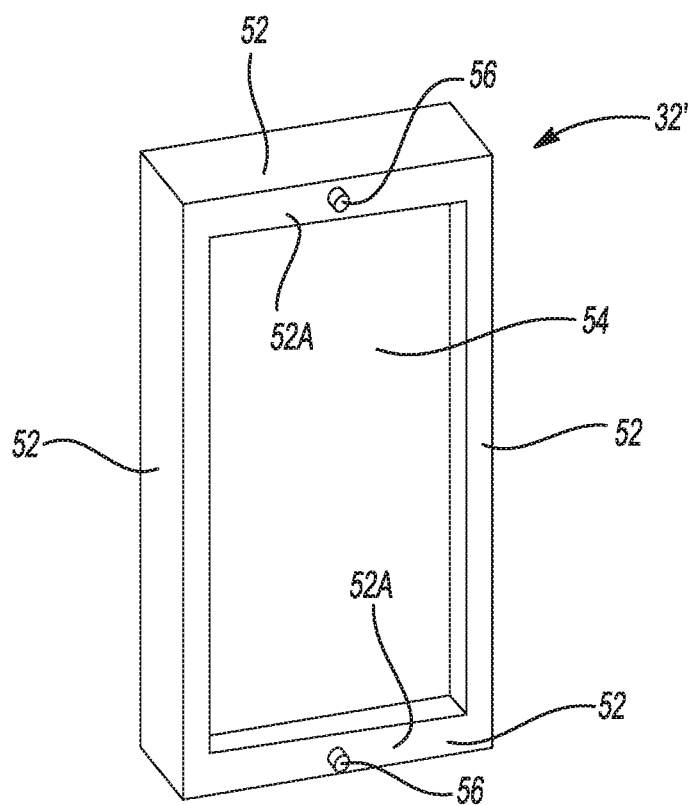
FIG. 5 is a bottom perspective view of the alternate cover shown in FIG. 4.
Figure 4:
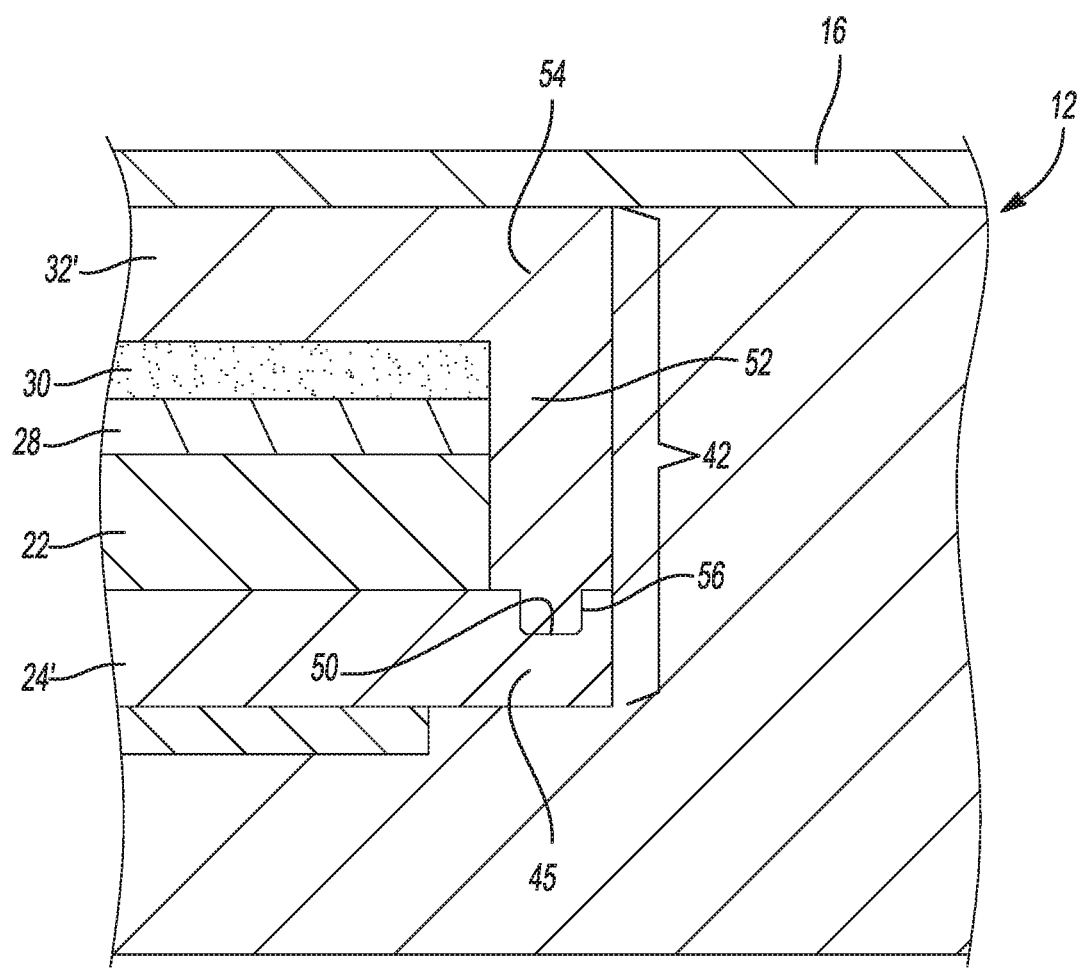
FIG. 4 is cross-section of the trim part viewed in the direction of arrows 2-2 in FIG. 1 showing another example of the cover.

FIGS. 4 and 5 show an alternate configuration of the cover 32, indicated by reference number 32', and the light guide 24, indicated by reference number 24'. In this configuration, the light guide 24' does not include the side wall 44 and the pin 46 and instead includes a slot 50. The slot 50 is located near a perimeter of the base portion 45. The cover 32' includes a cover side wall 52 extending from a plate portion 54. As shown in FIG. 5, the cover 32' may include four cover side walls 52 and substantially form a box shape. A pin 56 is disposed on a distal end 52A of the cover side wall 52. The pin 56 is disposed within the slot 50. Thus, the cover side wall 52 of the cover 32' contacts the PCB 22 and the film 28. The cover 32' may be connected to the light guide 24' as described above.

With combined reference to FIGS. 1-5, the light guide 24, 24' and the cover 32, 32' cooperate to encapsulate the PCB 22 and the film 28 during an injection molding process to create the trim part 12. For example, the in-mold electronics package 10 is first assembled by molding the light guide 24, 24' to the PCB 22, applying the film 28, and connecting the cover 32, 32' to the light guide 24. Thus, the light guide 24, 24' and the cover 32, 32' provide the at least one sealed perimeter wall 42 and, in certain aspects, completely encapsulates the PCB 22 and the film 28. Next, the in-mold electronics package 10 is inserted into an injection tool (not shown) and the substrate 14 is injected. The sealed perimeter wall 42 protects the PCB 22 and film 28 from the substrate 14 during injection. The substrate 14 contacts and encapsulates the sealed perimeter wall 42. In a second shot, the resin layer 16 is injection molded into the injection tool. The cover 32 protects the PCB 22 and the film 28 during the injection from the resin layer 16. The resin layer 16 contacts and encapsulates the cover 32. Once complete, the trim part 12 may be allowed to set up and be removed from the injection tool.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An in-mold electronics package comprising:
   a printed circuit board (PCB) having a first side and a second side, the PCB defining an opening;
   a light emitting diode (LED) disposed on the second side adjacent the opening;
   a light guide disposed on the second side of the PCB and partially disposed within the opening;
   a film disposed on the first side of the PCB; and
   a cover disposed over the film, the cover connected to the light guide, and wherein the cover and the light guide cooperate to form at least one sealed perimeter wall of the in-mold electronics package.

2. The in-mold electronics package of claim 1, wherein the light guide and the cover encapsulate the PCB and the film.

3. The in-mold electronics package of claim 1, wherein the film is adhered to the cover by an adhesive layer.

4. The in-mold electronics package of claim 1, wherein the film is adhered to the PCB by an adhesive layer.

5. The in-mold electronics package of claim 1, further comprising a reflector disposed on the light guide opposite the PCB.

6. The in-mold electronics package of claim 1, wherein the cover is translucent.

7. The in-mold electronics package of claim 1, wherein the cover is comprised of a same material as the light guide.

8. The in-mold electronics package of claim 1, wherein the cover is secured to the light guide at the at least one sealed perimeter wall.

9. The in-mold electronics package of claim 1, wherein the cover is secured to the light guide by a pin.

10. The in-mold electronics package of claim 1, wherein the cover is secured to the light guide by an ultrasonic weld.

11. The in-mold electronics package of claim 1, wherein the cover is more heat and pressure resistant than the film.

12. The in-mold electronics package of claim 1, wherein the light guide includes a side wall extending from a base portion, the side wall in contact with the cover to form the at least one sealed perimeter wall of the in-mold electronics package.

13. The in-mold electronics package of claim 1, wherein the cover includes a cover side wall extending from a plate portion, the cover side wall in contact with the light guide to form the at least one sealed perimeter wall of the in-mold electronics package.

14. The in-mold electronics package of claim 1, wherein the film includes translucent portions and non-translucent portions.

15. The in-mold electronics package of claim 1, wherein the PCB includes a touch capacitive sensor disposed adjacent the opening on the first side.

16. A trim part for a motor vehicle comprising: an electronics package including a front side and a back side, the electronics package having: a printed circuit board (PCB) having a first side facing the front side of the electronics package and a second side facing the back side of the electronics package, the PCB defining an opening; a light emitting diode (LED) disposed on the second side adjacent the opening; a light guide disposed on the second side of the PCB and partially disposed within the opening; a film disposed on the first side of the PCB; and a cover disposed over the film, the cover connected to the light guide, and wherein the cover and the light guide cooperate to form at least one sealed perimeter wall of the in-mold electronics package; a substrate injection molded onto the back side of the electronics package; and a resin layer injection molded onto the front side of the electronics package.

17. The trim part of claim 16, wherein the resin layer is translucent.

18. The trim part of claim 16, wherein the cover and the light guide encapsulate the PCB and the film.

19. The trim part of claim 16, wherein the substrate has the properties of an injection molded material and the resin layer has the properties of an injection molded material.

* * * * *